(12) United States Patent
Hu et al.

(10) Patent No.: US 11,156,679 B2
(45) Date of Patent: Oct. 26, 2021

(54) OPTIMIZED EXTREMELY-LARGE MAGNETIC FIELD MEASURING METHOD AND DEVICE

(71) Applicants: TSINGHUA UNIVERSITY, Beijing (CN); SICHUAN ENERGY INTERNET RESEARCH INSTITUTE, TSINGHUA UNIVERSITY, Sichuan (CN)

(72) Inventors: Jun Hu, Beijing (CN); Yong Ouyang, Sichuan (CN); Jinliang He, Beijing (CN); Shanxiang Wang, Beijing (CN); Gen Zhao, Beijing (CN); Zhongxu Wang, Beijing (CN); Rong Zeng, Beijing (CN); Chijie Zhuang, Beijing (CN); Bo Zhang, Beijing (CN); Zhanqing Yu, Beijing (CN)

(73) Assignees: TSINGHUA UNIVERSITY, Beijing (CN); SICHUAN ENERGY INTERNET RESEARCH INSTITUTE, TSINGHUA UNIVERSITY, Sichuan (CN)

( * ) Notice: Subject to any disclaimer, the term of this patent is extended or adjusted under 35 U.S.C. 154(b) by 235 days.

(21) Appl. No.: 16/462,417

(22) PCT Filed: Jun. 28, 2017

(86) PCT No.: PCT/CN2017/090544
§ 371 (c)(1),
(2) Date: May 20, 2019

(87) PCT Pub. No.: WO2018/090633
PCT Pub. Date: May 24, 2018

(65) Prior Publication Data
US 2019/0277924 A1    Sep. 12, 2019

(30) Foreign Application Priority Data

Nov. 18, 2016  (CN) .......................... 201611027078.8

(51) Int. Cl.
*G01R 33/09* (2006.01)

(52) U.S. Cl.
CPC .......... *G01R 33/098* (2013.01); *G01R 33/09* (2013.01)

(58) Field of Classification Search
CPC ............................. G01R 33/098; G01R 33/09
See application file for complete search history.

(56) References Cited

U.S. PATENT DOCUMENTS

2014/0266185 A1    9/2014 Sidman
2019/0369173 A1*   12/2019 Ouyang ............... G01R 33/093

FOREIGN PATENT DOCUMENTS

CN    102707246 A    10/2012
CN    103885005 A    6/2014
(Continued)

*Primary Examiner* — Minh Q Phan
(74) *Attorney, Agent, or Firm* — Novick, Kim & Lee, PLLC; Allen Xue

(57) ABSTRACT

An optimized extremely-large magnetic field measuring method includes: placing four orthogonally configured tunneling magnetoresistive resistors into an externally applied magnetic field, acquiring the resistances of the tunneling magnetoresistive resistors; calculating the angle between a magnetization direction of a free layer of each tunneling magnetoresistive resistor and that of a reference layer on the basis of the resistances of the four resistors; calculating magnetic field intensity $H_1$ and direction $\theta_1$ of the externally applied magnetic field calculating magnetic field intensity $H_2$ and direction $\theta_2$ of the externally applied magnetic field; and determining final magnetic field intensity $H_0$ of the externally applied magnetic field on the basis of magnetic field intensity $H_1$ and of magnetic field intensity $H_2$; deter- (Continued)

mining final direction $\theta$ of the externally applied magnetic field on the basis of direction $\theta_2$ and of direction $\theta_1$; and optimizing on the basis of direction $\theta$ and of magnetic field intensity $H_0$.

10 Claims, 1 Drawing Sheet

(56) References Cited

FOREIGN PATENT DOCUMENTS

| CN | 106556806 A | 4/2017 |
|----|-------------|--------|
| CN | 106772149 A | 5/2017 |
| TW | 487928 B | 5/2002 |
| TW | 201337302 A | 9/2013 |

* cited by examiner

OPTIMIZED EXTREMELY-LARGE MAGNETIC FIELD MEASURING METHOD AND DEVICE

FIELD

The present invention relates to the technical field of magnetic field measurement, and in particular, to an extremely-large magnetic field intensity measuring method.

BACKGROUND

Tunneling magnetoresistive resistors have good linearity and measurement accuracy when the magnetic field to be measured is small. When the external magnetic field is extremely large (160 Oe-2500 Oe, Oe is the unit of magnetic field intensity—Oersted), the tunneling magnetoresistive reference layer magnetic domain undergoes a significant rotation, and the tunneling magnetoresistive resistors enter a saturation region. The existing measuring methods are completely incapable of adapting to the measurement of an extremely-large magnetic field, and a new method needs to be proposed for the measurement of the extremely-large magnetic field.

SUMMARY

The technical problem to be solved by the present invention is to provide a method and device suitable for extremely-large magnetic field measurement in view of the above problems.

The present invention provides an optimized extremely-large magnetic field measuring method and device, comprising:

Step 1: placing four orthogonally configured tunneling magnetoresistive resistors into an externally applied magnetic field, and acquiring the resistance of each tunneling magnetoresistive resistor, wherein the first tunneling magnetoresistive resistor and the third tunneling magnetoresistive resistor are located in one straight line, the second tunneling magnetoresistive resistor and the fourth tunneling magnetoresistive resistor are located in another straight line, and the two straight lines are perpendicular to each other;

Step 2: calculating the angle between a magnetization direction of a free layer of each tunneling magnetoresistive resistor and that of a reference layer on the basis of the resistances of the four tunneling magnetoresistive resistors;

Step 3: calculating magnetic field intensity $H_1$ and direction $\theta_1$ of the externally applied magnetic field on the basis of the angle between the free layer magnetization direction and the reference layer magnetization direction of the first tunneling magnetoresistive resistor and of that of the third tunneling magnetoresistive resistor; calculating magnetic field intensity $H_2$ and direction $\theta_2$ of the externally applied magnetic field on the basis of the angle between the free layer magnetization direction and the reference layer magnetization direction of the second tunneling magnetoresistive resistor and of that of the fourth tunneling magnetoresistive resistor;

Step 4: determining magnetic field intensity $H_0$ of the externally applied magnetic field on the basis of magnetic field intensity $H_1$ and of magnetic field intensity $H_2$; determining final direction $\theta$ of the externally applied magnetic field on the basis of direction $\theta_2$ and of direction $\theta_1$; and Step 5: optimizing magnetic field intensity $H_0$ on the basis of direction $\theta$.

Further, in step 2, the equation for calculating the angle between the magnetization direction of the free layer of each tunneling magnetoresistive resistor and that of the reference layer on the basis of the resistance of the tunneling magnetoresistive resistor is: $R=R_{avg}[1-0.5\,\Delta_{max}\cos(\varphi_F-\varphi_R)]$;

wherein, $R_{avg}=(R_{max}+R_{min})/2$, $\Delta_{max}=(R_{max}-R_{min})/R_{avg}$, when the magnetization direction of the free layer and that of the reference layer are the same, the resistance of the tunneling magnetoresistive resistor is the smallest, that is $R_{min}$; when the magnetization direction of the free layer and that of the reference layer are opposite, the resistance of the tunneling magnetoresistive resistor is the largest, that is $R_{max}$; $\varphi_F-\varphi_R$ is the angle between the magnetization direction of the free layer and that of the reference layer of the tunneling magnetoresistive resistor; and R is the resistance of the tunneling magnetoresistive resistor in the externally applied magnetic field.

Further, in step 3, the formulas for calculating magnetic field intensity $H_1$ and direction $\theta_1$ are as follows:

$$\begin{cases} \theta_1 = \arctan\left(\dfrac{2\sin\varphi_{FR3}\sin\varphi_{FR3}}{\sin(\varphi_{FR3}-\varphi_{FR1})}\right) \\ H_1 = \dfrac{H_{BR}\sin(\varphi_{FR1}+\varphi_{FR3})}{\sqrt{\sin^2(\varphi_{FR1}-\varphi_{FR3})+(2\sin\varphi_{FR1}\sin\varphi_{FR3})^2}} \end{cases};$$

wherein, $H_{BR}$ is the amplitude of the internal bias field of the reference layer of the four tunneling magnetoresistive resistors; $\varphi_{FR1}$ is the angle between the magnetization direction of the free layer of the first tunneling magnetoresistive resistor and that of the reference layer; and $\varphi_{FR3}$ is the angle between the magnetization direction of the free layer of the third tunneling magnetoresistive resistor and that of the reference layer;

the formulas for calculating magnetic field intensity $H_2$ and direction $\theta_2$ are as follows:

$$\begin{cases} \theta_2 = \arctan\left(\dfrac{2\sin\varphi_{FR2}\sin\varphi_{FR4}}{\sin(\varphi_{FR4}-\varphi_{FR2})}\right) \\ H_2 = \dfrac{H_{BR}\sin(\varphi_{FR2}+\varphi_{FR4})}{\sqrt{\sin^2(\varphi_{FR2}-\varphi_{FR4})+(2\sin\varphi_{FR2}\sin\varphi_{FR4})^2}} \end{cases};$$

wherein, $H_{BR}$ is the amplitude of the internal bias field of the reference layer of the four tunneling magnetoresistive resistors; $\varphi_{FR2}$ is the angle between the magnetization direction of the free layer of the second tunneling magnetoresistive resistor and that of the reference layer; and $\varphi_{FR4}$ is the angle between the magnetization direction of the free layer of the fourth tunneling magnetoresistive resistor and that of the reference layer.

The step 4 of determining final magnetic field intensity $H_0$ and final direction $\theta$ of the externally applied magnetic field further includes:

$$H_0 = H_1 = H_2;$$

$$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

Step 5 further includes that the intensity of the optimized externally applied magnetic field $H=kH_0+b$, both k and b are correction factors.

The present invention also provides an optimized extremely-large magnetic field measuring device, comprising:

a tunneling magnetoresistive resistor resistance acquiring module, used for acquiring the resistances of the four tunneling magnetoresistive resistors orthogonally configured in the externally applied magnetic field; wherein, the first tunneling magnetoresistive resistor and the third tunneling magnetoresistive resistor are located in one straight line, the second tunneling magnetoresistive resistor and the fourth tunneling magnetoresistive resistor are located in another straight line, and the two straight lines are perpendicular to each other;

a tunneling magnetoresistive resistor free layer magnetization direction and reference layer magnetization direction angle calculating module, used for calculating the angle between the free layer magnetization direction of each tunneling magnetoresistive resistor and that of the reference layer on the basis of the resistances of the four tunneling magnetoresistive resistors;

an externally applied magnetic field intensity and direction pre-calculating module, used for calculating magnetic field intensity $H_1$ and direction $\theta 1$ of the externally applied magnetic field on the basis of the angle between the free layer magnetization direction of and the reference layer magnetization direction of the first tunneling magnetoresistive resistor and of that of the third tunneling magnetoresistive resistor, and calculating magnetic field intensity $H_2$ and direction $\theta_2$ of the externally applied magnetic field on the basis of the angle between the free layer magnetization direction of and the reference layer magnetization direction of the second tunneling magnetoresistive resistor and of that of the fourth tunneling magnetoresistive resistor;

an externally applied magnetic field intensity and direction determining module, used for determining final intensity $H_0$ of the externally applied magnetic field on the basis of magnetic field intensity $H_1$ and of magnetic field intensity $H_2$, and determining final direction $\theta$ of the externally applied magnetic field on the basis of direction $\theta_2$ and of direction $\theta_1$; and a magnetic field intensity optimizing module, used for optimizing magnetic field intensity $H_0$ on the basis of direction $\theta$.

The tunneling magnetoresistive resistor free layer magnetization direction and reference layer magnetization direction angle calculating module, further wherein the equation for calculating the angle between the magnetization direction of the free layer of each tunneling magnetoresistive resistor and that of the reference layer on the basis of the resistances of the tunneling magnetoresistive resistors is as follows:

$$R=R_{avg}[1-0.5\,\Delta_{max}\cos(\varphi_F-\varphi_R)];$$

wherein, $R_{avg}=(R_{max}+R_{min})/2$, $\Delta_{max}=(R_{max}-R_{min})/R_{avg}$, when the magnetization direction of the free layer and that of the reference layer are the same, the resistance of the tunneling magnetoresistive resistor is the smallest, that is $R_{min}$; when the magnetization direction of the free layer and that of the reference layer are opposite, the resistance of the tunneling magnetoresistive resistor is the largest, that is $R_{max}$; $\varphi_F-\varphi_R$ is the angle between the magnetization direction of the free layer of the tunneling magnetoresistive resistor and that of the reference layer; and R is the resistance of the tunneling magnetoresistive resistor in the externally applied magnetic field.

Further, the formulas used by the externally applied magnetic field intensity and direction pre-calculating module for calculating magnetic field intensity $H_1$ and direction $\theta_1$ are as follows:

$$\begin{cases} \theta_1 = \arctan\left(\dfrac{2\sin\varphi_{FR1}\sin\varphi_{FR3}}{\sin(\varphi_{FR3}-\varphi_{FR1})}\right) \\ H_1 = \dfrac{H_{BR}\sin(\varphi_{FR1}+\varphi_{FR3})}{\sqrt{\sin^2(\varphi_{FR1}-\varphi_{FR3})+(2\sin\varphi_{FR1}\sin\varphi_{FR3})^2}} \end{cases};$$

wherein, $H_{BR}$ is the amplitude of the internal bias field of the reference layer of the four tunneling magnetoresistive resistors; $\varphi_{FR1}$ is the angle between the magnetization direction of the free layer of the first tunneling magnetoresistive resistor and that of the reference layer; and $\varphi_{FR3}$ is the angle between the magnetization direction of the free layer of the third tunneling magnetoresistive resistor and that of the reference layer;

the formulas used by the externally applied magnetic field intensity and direction pre-calculating module for calculating magnetic field intensity $H_2$ and direction $\theta_2$ are as follows:

$$\begin{cases} \theta_2 = \arctan\left(\dfrac{2\sin\varphi_{FR2}\sin\varphi_{FR4}}{\sin(\varphi_{FR4}-\varphi_{FR2})}\right) \\ H_2 = \dfrac{H_{BR}\sin(\varphi_{FR2}+\varphi_{FR4})}{\sqrt{\sin^2(\varphi_{FR2}-\varphi_{FR4})+(2\sin\varphi_{FR2}\sin\varphi_{FR4})^2}} \end{cases};$$

wherein, $H_{BR}$ is the amplitude of the internal bias field of the reference layer of the four tunneling magnetoresistive resistors; $\varphi_{FR2}$ is the angle between the magnetization direction of the free layer of the second tunneling magnetoresistive resistor and that of the reference layer; and $\varphi_{FR4}$ is the angle between the magnetization direction of the free layer of the fourth tunneling magnetoresistive resistor and that of the reference layer.

Further, the externally applied magnetic field intensity and direction determining module makes use of the following formula to determine final intensity $H_0$ and final direction $\theta$ of the externally applied magnetic field:

$$H_0 = H_1 = H_2;$$

$$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

The magnetic field intensity optimizing module is further used for optimizing magnetic field intensity H of the externally applied magnetic field on the basis of the following formula:

$H=kH_0+b$, both k and b are correction factors.

In summary, due to the adoption of the above technical scheme, the beneficial effects of the present invention are as follows:

the extremely-large magnetic field measuring method provided by the invention realizes the accurate measurement of the extremely-large magnetic field, and expands the measurement range of the magnetic field intensity of the tunneling magnetoresistive resistors. At the same time, the present invention provides a method for optimizing the extremely-large magnetic field intensity, and further improving the accuracy of detecting the extremely-large magnetic field.

DRAWINGS

The invention will be illustrated by way of examples and with reference to the appended drawings, in which.

DETAILED DESCRIPTION OF THE EMBODIMENTS

All features disclosed in this specification, or steps in all methods or processes disclosed, may be combined in any manner other than mutually exclusive features and/or steps.

Any feature disclosed in this specification, unless specifically stated, may be replaced by other equivalents or alternative features with similar purposes. That is, unless specifically stated, each feature is just one example of a series of equivalents or similar features.

Figure 1:
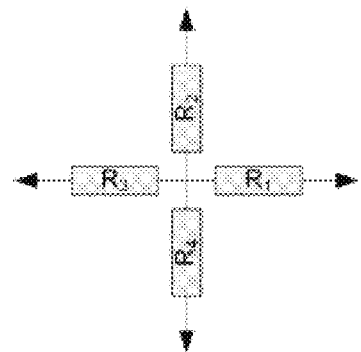
FIG. 1 is the tunneling magnetoresistive resistor's distribution diagram in an externally applied magnetic field.

Firstly, four orthogonally configured tunneling magnetoresistive resistors (I hereinafter referred to as resistors) are placed in an externally applied magnetic field, as shown in FIG. 1. Wherein, resistor R1 and resistor R3 are located in one straight line, resistor R2 and resistor R4 are located in another straight line, and the two straight lines are orthogonal to each other.

Figure 2:
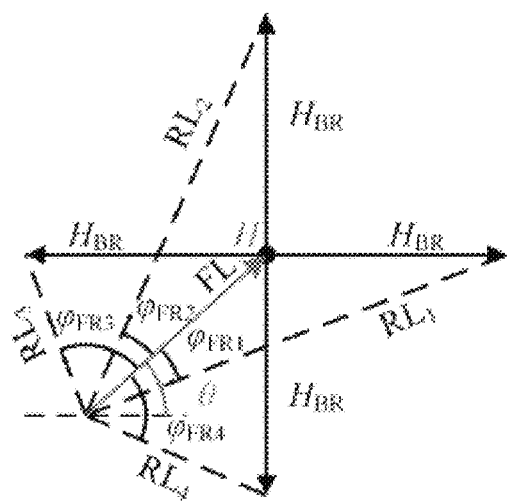
FIG. 2 is the vector diagram for extremely-large magnetic field measurement.

According to the above arrangement, the extremely-large magnetic field measurement distribution of the four tunneling magnetoresistive resistors is as shown in FIG. 2. Taking the direction of the resistor reference layer bias field as the reference direction, the four resistors are sequentially rotated by 90° in turn for orthogonal arrangement. H and θ in the figure are the amplitude and direction of the externally applied magnetic field, respectively; FL is the combined direction of the free layer magnetization directions of the four resistors, which can be approximately considered to be the same as the direction of the externally applied magnetic field; the four vectors $H_{BR}$ represent the magnitude and direction of the internal bias fields of the reference layers of the four tunneling magnetoresistive resistors; in this embodiment, the four magnetoresistive resistors are identical, so the magnitudes of the internal bias fields of their reference layers are considered to be identical, and the directions of the internal bias fields of the reference layers of the two adjacent magnetoresistive resistors are considered to eb orthogonal; $RL_{1,\,2,\,3,\,4}$ are respectively referred to be the reference layer magnetization directions of the four resistors, which are consistent with the combined direction of the externally applied magnetic field and their internal bias fields of the reference layers; and $\varphi_{FR1,\,2,\,3,\,4}$ are the angles between the magnetization directions of the free layers of the four resistors and those of the reference layers.

From the vector relation in FIG. 2, the relationship between the magnetization directions of the four chips and the externally applied magnetic field is obtained as follows:

$$\begin{cases} H\sin\varphi_{FR1} = H_{BR}\sin(\theta - \varphi_{FR1}) \\ H\sin\varphi_{FR2} = H_{BR}\cos(\theta + \varphi_{FR2}) \\ H\sin\varphi_{FR3} = H_{BR}\sin(\theta + \varphi_{FR3}) \\ H\sin\varphi_{FR4} = H_{BR}\cos(\theta - \varphi_{FR4}) \end{cases};$$

the amplitude and direction of the externally applied magnetic field can be obtained by calculation from two of the above equations. However, only two resistors cannot calculate the magnetic field on the entire two-dimensional plane. For example, when resistor R1 and resistor R3 are selected to calculate the externally applied magnetic field, it is obvious that it is mirror-symmetric when the externally applied magnetic field is 0°-180° and 180°-360°. Therefore, the range of externally applied magnetic field directions must be judged by the other two resistors at first, and then, two appropriate resistors are selected for calculation.

With resistor R1 and resistor R3 as a group, it can be calculated that:

$$\begin{cases} \theta_1 = \arctan\left(\dfrac{2\sin\varphi_{FR1}\sin\varphi_{FR3}}{\sin(\varphi_{FR3} - \varphi_{FR1})}\right) \\ H_1 = \dfrac{H_{BR}\sin(\varphi_{FR1} + \varphi_{FR3})}{\sqrt{\sin^2(\varphi_{FR1} - \varphi_{FR3}) + (2\sin\varphi_{FR1}\sin\varphi_{FR3})^2}} \end{cases};$$

wherein, $H_1$ and $\theta_1$ are the magnitude and direction of the externally applied magnetic field obtained by calculation via $R_1$ and $R_3$, respectively.

With resistor R2 and resistor R4 as a group, it can be calculated that:

$$\begin{cases} \theta_2 = \arctan\left(\dfrac{2\sin\varphi_{FR2}\sin\varphi_{FR4}}{\sin(\varphi_{FR4} - \varphi_{FR2})}\right) \\ H_2 = \dfrac{H_{BR}\sin(\varphi_{FR2} + \varphi_{FR4})}{\sqrt{\sin^2(\varphi_{FR2} - \varphi_{FR4}) + (2\sin\varphi_{FR2}\sin\varphi_{FR4})^2}} \end{cases};$$

wherein, $H_2$ and $\theta_2$ are the magnitude and direction of the externally applied magnetic field obtained by calculation via R2 and R4, respectively.

By comparing the angles calculated by the above two formulas, the magnitude and direction of the externally applied magnetic field can be acquired as:

$$H_0 = H_1 = H_2;$$

$$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

In the above formula, the angle between the magnetization direction of the free layer of each tunneling magnetoresistive resistor and that of the reference layer is acquired by the following formula.

The resistance of each tunneling magnetoresistive resistor depends on the angle between the magnetization direction of the free layer of the tunneling magnetoresistive resistor and that of the reference layer. When the magnetization direction of the free layer and that of the reference layer are the same, the resistance is the smallest, that is $R_{min}$. When the magnetization direction of the free layer and that of the reference layer are opposite, the resistance is the largest, that is $R_{max}$, $R_{min}$ and $R_{max}$ can be obtained by calibration.

In the externally applied magnetic field, the relationship of the resistance of each tunneling magnetoresistive resistor and the magnetization direction of the free layer and that of the reference layer is as follows:

$$R=R_{avg}[1-0.5\, \Delta_{max} \cos(\varphi_F-\varphi_R)];$$

wherein, $R_{avg}=(R_{max}+R_{min})/2$, which is the average resistance, and $\Delta max=(R_{max}-R_{min})/R_{avg}$, which is the maximum magnetoresistance change rate.

By experiments, we found that the intensity of the extremely large magnetic field calculated by the above steps has a certain difference from the actual value, and it basically keeps a linear relationship with the actual value, so it can be corrected.

Since the direction of the magnetic field calculated by the foregoing steps is basically accurate, it is only necessary to correct the amplitude of the magnetic field. The correction scheme is: $H=kH_0+b$, $H_0$ is the intensity of the externally applied magnetic field acquired in the foregoing steps, both k and b are correction factors, which are related to the measured magnetic field angle, and H is the optimized magnetic field amplitude. The relationship between the correction factors k and b and the direction of the measured magnetic field is as follows:

$$\begin{cases} k = 1.71 - 0.18|\cos 2\theta|, & 0 < \theta < \pi/2 \\ b = 0.19\theta - 0.94, & -0.1 < \theta < \pi/4 - 0.1 \end{cases};$$

Other angular ranges satisfy the periodic characteristics.

It should be noted that the correction factors k and b are different for different magnetoresistive resistors, and it is necessary to test and calibrate for specific ones. The specific method is to compare $H_0$ obtained by calculation in the present invention with the real magnetic field (the result measured by an instrument with higher precision), and then to obtain the numerical relationship between $H_0$ and the real magnetic field by means of numerical fitting.

The present invention also provides a set of soft systems corresponding to the steps of the above method one by one.

The present invention is not limited to the specific embodiments described above. The present invention extends to any new feature or any new combination disclosed in this specification, as well as any steps of new methods or processes or any new combination disclosed.

The invention claimed is:

1. A method for measuring magnetic field, comprising:
   Step 1: placing four orthogonally configured tunneling magnetoresistive resistors into an externally applied magnetic field, and acquiring the resistance of each tunneling magnetoresistive resistor, wherein the first tunneling magnetoresistive resistor and the third tunneling magnetoresistive resistor are located in a first straight line, the second tunneling magnetoresistive resistor and the fourth tunneling magnetoresistive resistor are located in a second straight line, and the first straight line and the second straight line are perpendicular to each other;
   Step 2: for each one of the four tunneling magnetoresistive resistors, calculating the angle between a magnetization direction of a free layer of the resistor and a reference layer of the resistor on the basis of the resistances of the resistor;
   Step 3: calculating magnetic field intensity $H_1$ and direction $\theta_1$ of the externally applied magnetic field on the basis of the angle between the free layer magnetization direction of and the reference layer magnetization direction of the first tunneling magnetoresistive resistor and of that of the third tunneling magnetoresistive resistor; calculating magnetic field intensity $H_2$ and direction $\theta_2$ of the externally applied magnetic field on the basis of the angle between the free layer magnetization direction of and the reference layer magnetization direction of the second tunneling magnetoresistive resistor and of that of the fourth tunneling magnetoresistive resistor;
   Step 4: determining final magnetic field intensity $H_0$ of the externally applied magnetic field on the basis of magnetic field intensity $H_1$ and of magnetic field intensity $H_2$; determining final direction $\theta_0$ of the externally applied magnetic field on the basis of direction $\theta_2$ and of direction $\theta_1$; and
   Step 5: optimizing magnetic field intensity $H_0$ on the basis of direction $\theta$.

2. The method of claim 1, wherein, in Step 2, an equation for calculating the angle between the magnetization direction of the free layer of each tunneling magnetoresistive resistor and that of the reference layer on the basis of the resistance of the tunneling magnetoresistive resistor is:

$$R=R_{avg}[1-0.5\, \Delta_{max} \cos(\varphi_F-\varphi_R)];$$

wherein, $$R_{avg}=(R_{max}+R_{min})/2,$$

$$\Delta_{max}=(R_{max}-R_{min})/R_{avg},$$

$R_{min}$ is the resistance of the tunneling magnetoresistive resistor when the magnetization direction of the free layer and that of the reference layer are the same, $R_{max}$ is the resistance of the tunneling magnetoresistive resistor when the magnetization direction of the free layer and that of the reference layer are opposite to each other, $\varphi_F-\varphi_R$ is the angle between the magnetization direction of the free layer of the tunneling magnetoresistive resistor and that of the reference layer; and R is the resistance of the tunneling magnetoresistive resistor in the externally applied magnetic field.

3. The method of claim 1, wherein, in Step 3, magnetic field intensity $H_1$ and direction $\theta_1$ are calculated according to $$\begin{cases} \theta_1 = \arctan\left(\dfrac{2\sin\varphi_{FR1}\sin\varphi_{FR3}}{\sin(\varphi_{FR3}-\varphi_{FR1})}\right) \\ H_1 = \dfrac{H_{BR}\sin(\varphi_{FR1}+\varphi_{FR3})}{\sqrt{\sin^2(\varphi_{FR1}-\varphi_{FR3})+(2\sin\varphi_{FR1}\sin\varphi_{FR3})^2}} \end{cases};$$

wherein, $H_{BR}$ is the amplitude of the internal bias field of the reference layer of the four tunneling magnetoresistive resistors, $\varphi_{FR1}$ is the angle between the magnetization direction of the free layer and that of the reference layer of the first tunneling magnetoresistive resistor, and $\varphi_{FR3}$ is the angle between the magnetization direction of the free layer and that of the reference layer of the third tunneling magnetoresistive resistor, and magnetic field intensity $H_2$ and direction $\theta_2$ are calculated according to $$\begin{cases} \theta_2 = \arctan\left(\dfrac{2\sin\varphi_{FR2}\sin\varphi_{FR4}}{\sin(\varphi_{FR4} - \varphi_{FR2})}\right) \\ H_2 = \dfrac{H_{BR}\sin(\varphi_{FR2} + \varphi_{FR4})}{\sqrt{\sin^2(\varphi_{FR2} - \varphi_{FR4}) + (2\sin\varphi_{FR2}\sin\varphi_{FR4})^2}} \end{cases},$$

wherein, $H_{BR}$ is the amplitude of the internal bias field of the reference layer of the four tunneling magnetoresistive resistors, $\varphi_{FR2}$ is the angle between the magnetization direction of the free layer of the second tunneling magnetoresistive resistor and that of the reference layer, and $\varphi_{FR4}$ is the angle between the magnetization direction of the free layer of the fourth tunneling magnetoresistive resistor and that of the reference layer.

4. The method of claim 1, wherein, in Step 4, $H_0 = H_1 = H_2$, and $$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

5. The method of claim 1, wherein the intensity of the optimized externally applied magnetic field is $H=kH_0+b$, wherein k and b are correction factors.

6. A device for measuring magnetic field, comprising:
a tunneling magnetoresistive resistor resistance acquiring module, for acquiring the resistances of the four tunneling magnetoresistive resistors orthogonally configured in the externally applied magnetic field,
wherein, the first tunneling magnetoresistive resistor and the third tunneling magnetoresistive resistor are located in a first straight line, the second tunneling magnetoresistive resistor and the fourth tunneling magnetoresistive resistor are located in a second straight line, and the first straight line and the second straight line are perpendicular to each other;
a tunneling magnetoresistive resistor free layer magnetization direction and reference layer magnetization direction angle calculating module for calculating the angle between the free layer magnetization direction for each one of the four tunneling magnetoresistive resistors and the corresponding reference layer thereof on the basis of the resistance thereof;
an externally applied magnetic field intensity and direction pre-calculating module, for calculating magnetic field intensity $H_1$ and direction $\theta_1$ of the externally applied magnetic field on the basis of the angle between the free layer magnetization direction and the reference layer magnetization direction of the first tunneling magnetoresistive resistor and of that of the third tunneling magnetoresistive resistor, calculating field intensity $H_2$ and direction $\theta_2$ of the externally applied magnetic field on the basis of the angle between the free layer magnetization direction and the reference layer magnetization direction of the second tunneling magnetoresistive resistor and of that of the fourth tunneling magnetoresistive resistor;

an externally applied magnetic field intensity and direction determining module, for determining final intensity $H_0$ of the externally applied magnetic field on the basis of magnetic field intensity $H_1$ and of magnetic field intensity $H_2$, and determining final direction $\theta$ of the externally applied magnetic field on the basis of direction $\theta_2$ and of direction $\theta_1$; and a magnetic field intensity optimizing module for optimizing magnetic field intensity $H_0$ on the basis of direction $\theta$.

7. The device of claim 6, wherein the tunneling magnetoresistive resistor free layer magnetization direction and reference layer magnetization direction angle calculating module, further wherein the equation for calculating the angle between the magnetization direction of the free layer of each tunneling magnetoresistive resistor and that of the reference layer on the basis of the resistances of the tunneling magnetoresistive resistors is as follows:

$R = R_{avg}[1 - 0.5\Delta_{max} \cos(\varphi_F - \varphi_R)];$ wherein, $R_{avg} = (R_{max} + R_{min})/2,$ $\Delta_{max} = (R_{max} - R_{min})/R_{avg},$ $R_{min}$ is the resistance of the tunneling magnetoresistive resistor when the magnetization direction of the free layer and that of the reference layer are the same, $R_{max}$ is the resistance of the tunneling magnetoresistive resistor when the magnetization direction of the free layer and that of the reference layer are opposite, $\varphi_F - \varphi_R$ is the angle between the magnetization direction of the free layer and that of the reference layer of the tunneling magnetoresistive resistor, and R is the resistance of the tunneling magnetoresistive resistor in the externally applied magnetic field.

8. The device of claim 6, wherein magnetic field intensity $H_1$ and direction $\theta_1$ are according to $$\begin{cases} \theta_1 = \arctan\left(\dfrac{2\sin\varphi_{FR1}\sin\varphi_{FR3}}{\sin(\varphi_{FR3} - \varphi_{FR1})}\right) \\ H_1 = \dfrac{H_{BR}\sin(\varphi_{FR1} + \varphi_{FR3})}{\sqrt{\sin^2(\varphi_{FR1} - \varphi_{FR3}) + (2\sin\varphi_{FR1}\sin\varphi_{FR3})^2}} \end{cases},$$

wherein, $H_{BR}$ is the amplitude of the internal bias field of the reference layer of the four tunneling magnetoresistive resistors, $\varphi_{FR1}$ is the angle between the magnetization direction of the free layer and that of the reference layer of the first tunneling magnetoresistive resistor, and $\varphi_{FR3}$ is the angle between the magnetization direction of the free layer and that of the reference layer of the third tunneling magnetoresistive resistor; and wherein magnetic field intensity $H_2$ and direction $\theta_2$ are according to:

$$\begin{cases} \theta_2 = \arctan\left(\dfrac{2\sin\varphi_{FR2}\sin\varphi_{FR4}}{\sin(\varphi_{FR4} - \varphi_{FR2})}\right) \\ H_2 = \dfrac{H_{BR}\sin(\varphi_{FR2} + \varphi_{FR4})}{\sqrt{\sin^2(\varphi_{FR2} - \varphi_{FR4}) + (2\sin\varphi_{FR2}\sin\varphi_{FR4})^2}} \end{cases},$$

wherein, $H_{BR}$ is the amplitude of the internal bias field of the reference layer of the four tunneling magnetoresistive resistors, $\varphi_{FR2}$ is the angle between the magnetization direction of the free layer and that of the reference layer of the second tunneling magnetoresistive resistor, and $\varphi_{FR4}$ is the angle between the magnetization direction of the free layer and that of the reference layer of the fourth tunneling magnetoresistive resistor.

9. The device of claim 6, wherein final intensity $H_0$ and final direction $\theta$ of the externally applied magnetic field are according to:

$$H_0 = H_1 = H_2, \text{ and}$$

$$\theta = \begin{cases} \theta_1, & \theta_1 \geq 0, \theta_2 \geq 0 \\ -\theta_1, & \theta_1 \geq 0, \theta_2 < 0 \\ \theta_1 + \pi, & \theta_1 < 0, \theta_2 \geq 0 \\ -\theta_1 - \pi, & \theta_1 < 0, \theta_2 < 0 \end{cases}.$$

10. The device of claim 6, wherein magnetic field intensity H of the externally applied magnetic field is $H = kH_0 + b$, and k and b are correction factors.

* * * * *